United States Patent
Friedman et al.

(10) Patent No.: US 7,424,201 B2
(45) Date of Patent: Sep. 9, 2008

(54) METHOD FOR FIELD-PROGRAMMING A SOLID-STATE MEMORY DEVICE WITH A DIGITAL MEDIA FILE

(75) Inventors: David R. Friedman, Menlo Park, CA (US); Melissa H. Selcher, Menlo Park, CA (US); Manish Bhatia, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 1011 days.

(21) Appl. No.: 09/823,489

(22) Filed: Mar. 30, 2001

(65) Prior Publication Data

US 2002/0144277 A1    Oct. 3, 2002

(51) Int. Cl.
*H04N 5/91* (2006.01)
(52) U.S. Cl. .............................. 386/52; 386/95; 386/112
(58) Field of Classification Search ................... 386/46, 386/52, 68, 83, 111; 711/103, 104
See application file for complete search history.

(56) References Cited

U.S. PATENT DOCUMENTS

| | | | |
|---|---|---|---|
| 4,646,266 A | 2/1987 | Ovshinsky et al. |
| 5,132,992 A | 7/1992 | Yurt et al. |
| 5,253,275 A | 10/1993 | Yurt et al. |
| 5,539,908 A | 7/1996 | Chen et al. |
| 5,592,511 A | 1/1997 | Schoen et al. |
| 5,615,264 A | 3/1997 | Kazmierczak et al. |
| 5,636,276 A | 6/1997 | Brugger |
| 5,734,719 A | 3/1998 | Tsevdos et al. |
| 5,751,012 A | 5/1998 | Wolstenholme et al. |
| 5,768,597 A | 6/1998 | Simm |
| 5,835,396 A | 11/1998 | Zhang |

(Continued)

FOREIGN PATENT DOCUMENTS

EP    1056287 A2 *    11/2000

(Continued)

OTHER PUBLICATIONS

"MultiMedia Card—Product/Applications Background Report," http://www.sandisk.com/pr/mmc_back-main.htm, 5 pages (Aug. 2000).

(Continued)

*Primary Examiner*—Huy T Nguyen
(74) *Attorney, Agent, or Firm*—Brinks Hofer Gilson & Lione

(57) ABSTRACT

The preferred embodiments described herein provide a method for field-programming a solid-state memory device with a digital media file. In one preferred embodiment, a solid-state memory device is provided that comprises a memory array comprising a plurality of field-programmable memory cells. A digital media file is selected for storage in the memory device, and a digital media source field-programs the memory cells of the memory device with the selected digital media file. After the digital media file is stored in the memory device, the stored digital media file can be played using a digital playback device. In some embodiments, the memory array is a three-dimensional memory array, and the memory cells are write-once memory cells. Other preferred embodiments are provided, and each of the preferred embodiments described herein can be used alone or in combination with one another.

43 Claims, 4 Drawing Sheets

U.S. PATENT DOCUMENTS

| | | | |
|---|---|---|---|
| 5,838,996 | A | 11/1998 | deCarmo |
| 5,857,020 | A | 1/1999 | Peterson, Jr. |
| 5,864,801 | A | 1/1999 | Sugiyama et al. |
| 5,889,863 | A | 3/1999 | Weber |
| 5,915,167 | A * | 6/1999 | Leedy ................. 438/108 |
| 5,931,925 | A | 8/1999 | McNabb et al. |
| 5,944,608 | A | 8/1999 | Reed et al. |
| 5,946,045 | A | 8/1999 | Ozkan et al. |
| 5,949,411 | A | 9/1999 | Doerr et al. |
| 5,949,688 | A * | 9/1999 | Montoya et al. ............ 700/235 |
| 5,963,916 | A | 10/1999 | Kaplan |
| 5,966,495 | A * | 10/1999 | Takahashi et al. ............ 386/68 |
| 5,986,690 | A | 11/1999 | Hendricks |
| 5,987,140 | A | 11/1999 | Rowney et al. |
| 5,990,882 | A | 11/1999 | Heinonen et al. |
| 5,999,949 | A | 12/1999 | Crandall |
| 6,014,688 | A | 1/2000 | Venkatraman et al. |
| 6,014,726 | A | 1/2000 | Obata et al. |
| 6,025,553 | A | 2/2000 | Lee |
| 6,031,795 | A | 2/2000 | Wehmeyer |
| 6,032,130 | A | 2/2000 | Alloul et al. |
| 6,034,882 | A * | 3/2000 | Johnson et al. ............ 365/103 |
| 6,052,780 | A | 4/2000 | Glover |
| 6,055,180 | A | 4/2000 | Gudesen et al. |
| 6,058,372 | A | 5/2000 | Sweet et al. |
| 6,084,168 | A | 7/2000 | Sitrick |
| 6,085,195 | A | 7/2000 | Hoyt et al. |
| 6,101,483 | A | 8/2000 | Petrovich et al. |
| 6,111,612 | A | 8/2000 | Ozkan et al. |
| 6,185,122 | B1 | 2/2001 | Johnson et al. |
| 6,236,587 | B1 | 5/2001 | Gudesen et al. |
| 6,317,784 | B1 * | 11/2001 | Mackintosh et al. ........ 709/219 |
| 6,420,215 | B1 | 7/2002 | Knall et al. |
| 6,424,581 | B1 | 7/2002 | Bosch et al. |
| 6,438,638 | B1 * | 8/2002 | Jones et al. ................. 710/301 |
| 6,515,888 | B2 | 2/2003 | Johnson et al. |
| 6,545,891 | B1 | 4/2003 | Tringali et al. |
| 6,545,898 | B1 | 4/2003 | Scheuerlein |
| 6,574,145 | B2 | 6/2003 | Kleveland et al. |
| 6,584,541 | B2 * | 6/2003 | Friedman et al. ............ 711/103 |
| 6,618,295 | B2 | 9/2003 | Scheuerlein et al. |
| 6,631,085 | B2 | 10/2003 | Kleveland et al. |
| 6,633,509 | B2 | 10/2003 | Scheuerlein et al. |
| 6,647,389 | B1 | 11/2003 | Fitch et al. |
| 6,651,133 | B2 | 11/2003 | Moore et al. |
| 6,658,438 | B1 | 12/2003 | Moore et al. |
| 6,707,891 | B1 | 3/2004 | Guedalia |
| 6,711,464 | B1 * | 3/2004 | Yap et al. .................... 700/233 |
| 6,748,237 | B1 * | 6/2004 | Bates et al. ............. 455/553.1 |
| 6,778,974 | B2 | 8/2004 | Moore et al. |
| 6,834,312 | B2 | 12/2004 | Edwards et al. |
| 2002/0062171 | A1 * | 5/2002 | Tseng et al. ................ 700/231 |
| 2002/0065730 | A1 * | 5/2002 | Nii .............................. 705/26 |
| 2002/0108054 | A1 | 8/2002 | Moore et al. |
| 2002/0112005 | A1 * | 8/2002 | Namias ...................... 709/206 |
| 2002/0143792 | A1 | 10/2002 | Belu |
| 2006/0242429 | A1 | 10/2006 | Holtzman et al. |
| 2007/0056042 | A1 | 3/2007 | Qawami et al. |

FOREIGN PATENT DOCUMENTS

WO     WO 01/14981 A1     3/2001

OTHER PUBLICATIONS

"Vending machines make custom music CDs," http://www.cnn.com/TECH/ptech/9903/19/music.vending.machine/, 3 pages (Mar. 19, 1999).

"Introducing Liquid Kiosk Network 2.0," http://www.liquidaudio.com/services/retailers/liqkiosk/liqkiosk.html, 2 pages (2001).

"Liquid Kiosk Network," 2 pages (Nov. 2000).

"Liquid Audio Re-Invents Music Kiosks," wysiwyg://55/http://www.kiomag.com/archive/nov2000/4.shtml, 3 pages (Nov. 2000).

"MusicTeller Designs an ATM for Digital Tunes," http://www.pcworld.com/resource/printable/article/0,aid,44043,00.asp, 2 pages (Mar. 12, 2001).

"Low-Cost Three-Dimensional Memory Array," U.S. Appl. No. 09/638,428, filed Aug. 14, 2000; inventors: Mark G. Johnson, Thomas H. Lee, Vivek Subramanian, and P. Michael Farmwald.

"Modular Memory Device," U.S. Appl. No. 09/638,334, filed Aug. 14, 2000; inventors: J. James Tringali, P. Michael Farmwald, Thomas H. Lee, Mark G. Johnson, and Derek J. Bosch.

"Method for Storing Digital Information in Write-Once Memory Array," U.S. Appl. No. 09/727,229, filed Nov. 30, 2000; inventors: David R. Friedman, Derek J. Bosch, Christopher S. Moore, J. James Tringali, and Michael A. Vyyoda.

"Matsushita Electric, SanDisk and Toshiba Agree to Join Forces to Develop and Promote Next Generation Secure Memory Card," 4 pages, 2001.

Menezes et al., "Handbook of Applied Cryptography," pp. 403-405, 506-515, 570, 1997.

Schneier et al, "Applied Cryptography," pp. 574-577, 1996.

\* cited by examiner

METHOD FOR FIELD-PROGRAMMING A SOLID-STATE MEMORY DEVICE WITH A DIGITAL MEDIA FILE

BACKGROUND

A variety of portable consumer products, such as digital cameras, digital audio players, and personal digital assistants (PDAs), have been introduced that read and store digital data on hand-held, modular solid-state memory devices. These solid-state memory devices typically contain a two-dimensional array of write-many memory cells. Because this memory design assumes that high-speed read access is an important goal, the basic memory cell is designed to provide a relatively large read current, ensuring a relatively fast read access. To produce these relatively large read currents, relatively large switching devices are needed, and the large devices give rise to relatively large memory cells. Large memory cells cause the memory chip area to be large, which means the memory chip cost will be high (since the cost increases as the area grows). For example, the actual sales price per megabyte in June 2000 for a write-many flash memory card, such as a CompactFlash card, was between $2-4 at the forty megabyte level.

Because these devices are relatively expensive, they are unlikely to be used to permanently store digital media files. Instead, these devices are more likely to be used as vehicles to move digital media files onto less-expensive storage media. For example, a user can copy a digital audio file stored on a CompactFlash card onto a hard drive of a personal computer and later burn the digital audio file onto a compact disc, which is a much less expensive portable storage device. Additionally, because typical solid-state memory devices contain write-many memory cells, copy protection systems are needed that allow a user to copy digital media files onto less expensive media while preventing further copying. Further, because the data stored in a write-many memory device can be altered, it can be difficult to ensure the integrity of copyrighted material stored therein.

There is a need, therefore, for a method for field-programming a solid-state memory device with a digital media file that will overcome the difficulties discussed above.

SUMMARY

The present invention is defined by the following claims, and nothing in this section should be taken as a limitation on those claims.

By way of introduction, the preferred embodiments described below provide a method for field-programming a solid-state memory device with a digital media file. In one preferred embodiment, a solid-state memory device is provided that comprises a memory array comprising a plurality of field-programmable memory cells. A digital media file is selected for storage in the memory device, and a digital media source field-programs the memory cells of the memory device with the selected digital media file. After the digital media file is stored in the memory device, the stored digital media file can be played using a digital playback device. In some embodiments, the memory array is a three-dimensional memory array, and the memory cells are write-once memory cells. Other preferred embodiments are provided, and each of the preferred embodiments described herein can be used alone or in combination with one another.

The preferred embodiments will now be described with reference to the attached drawings.

DETAILED DESCRIPTION OF THE PRESENTLY PREFERRED EMBODIMENTS

Figure 1:
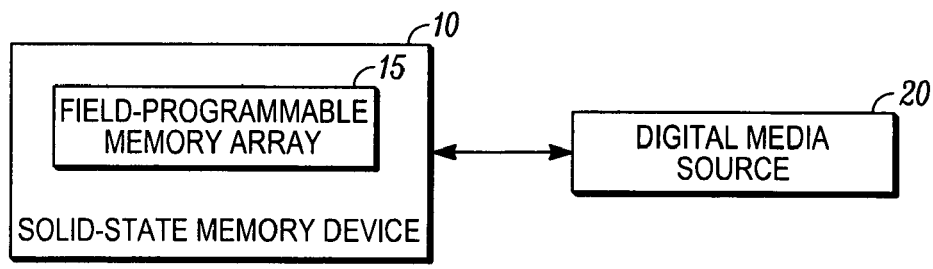
FIG. 1 is an illustration of a preferred embodiment in which a solid-state memory device comprising a field-programmable memory array is coupled with a digital media source.

Turning now to the drawings, FIG. 1 is an illustration of a solid-state memory device 10 of a preferred embodiment. The term "solid-state memory device" refers to a memory device that responds to electrical read and write signals to cause digital information to be read from and stored in a memory array of the device. The term does not encompass optical memory devices such as CD ROMs. The memory device 10 comprises a memory array 15 comprising a plurality of field-programmable memory cells. A field-programmable memory cell is a memory cell that is fabricated in an initial, un-programmed digital state that can be switched to an alternative, programmed digital state at a time after fabrication of the memory cell. For example, the original, un-programmed digital state can be identified as the Logic 0 state, and the programmed digital state can be identified as the Logic 1 state (or the Logic 2 state in a three-state digital system).

The memory device 10 of FIG. 1 is a compact, handheld unit that is easily transported and can take the form of a memory card or stick comprising a housing to protect the internal components of the device 10. In this embodiment, the memory device 10 further comprises an external electrical connector (not shown) coupled with the memory array 15. The memory device 10 is modular in the sense that it can be easily connected to and disconnected from a device having a mating electrical connector. As used herein, the terms "connected to" and "coupled with" are intended broadly to cover elements that are connected to or coupled with one another either directly or indirectly through one or more intervening components. As described below, some embodiments do not require the use of an external electrical connector.

In FIG. 1, the modular memory device 10 is shown releasably coupled with a digital media source 20. The term "digital media source" is intended to broadly refer to any device that can field-program a digital media file into a plurality of field-programmable memory cells of a solid-state memory device. The digital media source can itself contain the digital media file or can be used to retrieve the digital media file from another location (such as a local storage device or a remote storage device accessible via a network such as the Internet) via a wire or wireless connection. The term "digital media file" is intended broadly to encompass a file of copyrightable subject matter such as digital music, digital audio (e.g., voice/speech), digital video, at least one digital still image, a sequence of digital images, digital books, digital text (e.g., news or driving directions), a digital map, digital data (e.g. games or software), or any combination thereof. Further, the term "file" is intended broadly to cover all or part of a digital file. For example, a file can include data defining all or part of a song, image, or the like. Because the memory device 10 contains a field-programmable memory array 15, the digital media source 20 can write a digital media file into the memory device 10 at a time after the memory device's fabrication. For example, the memory device 10 can be written into at the command of a consumer when it is desired to load a new digital media file into the memory device 10.

Figure 2:
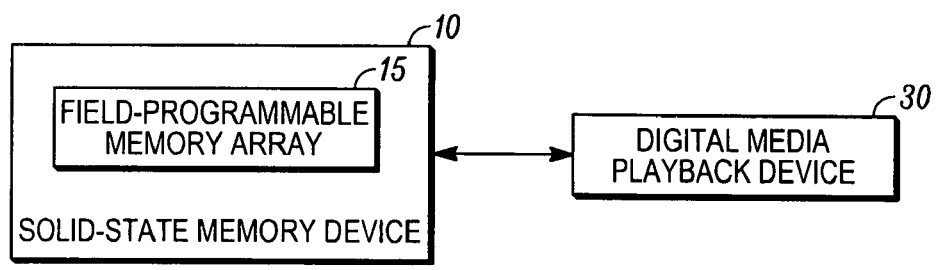
FIG. 2 is an illustration of a preferred embodiment in which the memory device of FIG. 1 is coupled with a digital media playback device.

After a digital media file is stored in the memory array 15, the memory device 10 can be disconnected from the digital media source 20 (e.g., by pulling the memory device 10 out of a port in the digital media source 20) and connected to a digital media playback device 30 (e.g., by plugging the memory device 10 into a port in the digital playback device 30), as shown in FIG. 2. Like the digital media source 20, the digital media playback device 30 has an electrical connector configured to mate with the electrical connector of the memory device 10. As described below, a digital media file stored in the memory device 10 can be transferred to the digital media playback device 30 without the use of mating electrical connectors. Examples of digital media playback devices include, but are not limited to, consumer devices such as a digital audio player, a digital audio book, an electronic book, a digital camera, a game player, a general-purpose computer, a personal digital assistant, a portable telephone, a printer, and a projector.

After the memory device 10 and digital media playback device 30 are connected, the digital media playback device 30 can play the digital media file stored in the memory device 10. The term "play" broadly encompasses visual playback via a suitable display (e.g., showing still or moving images or displaying pages of an electronic book) and/or audio playback via a suitable speaker (e.g., playing audio files through a pair of headphones), as well as other forms of sensory presentation (e.g., tactile or olfactory). A digital media file can also be played without providing a sensory presentation. For example, a digital media file that stores a software application, such as a driver for an existing application, can be played by executing the application. The application is "played" even though no visual or audible indication of its execution is provided. In addition to playing digital media files, a digital media playback device can be used to acquire digital information and field-program a memory device with the acquired information. For example, a digital camera can be used to both view images stored in a memory device (using the camera's liquid crystal display) and store images acquired by the camera onto the same or different memory device.

The following paragraphs present examples of how a digital media source 20 can field-program the memory device 10 with a digital media file. These examples will be discussed in conjunction with the flow chart of FIG. 3. It should be noted that the acts shown in the flow chart can be performed in any suitable order and need not follow the order used in the below illustrations. For example, the act of selecting (act 60) can be performed before the act of connecting (act 50).

Figure 4:
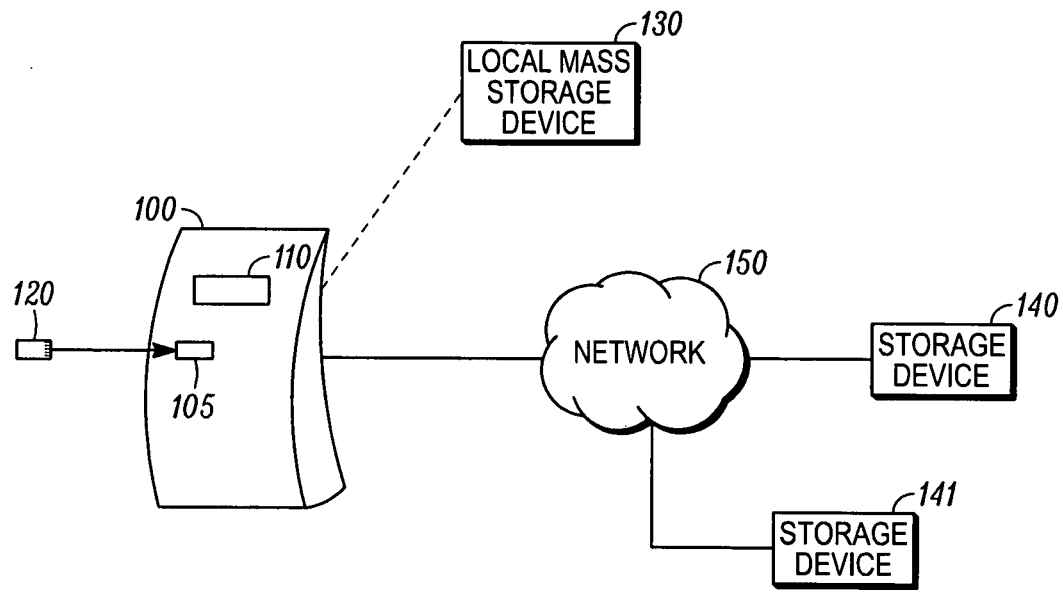
FIG. 4 is an illustration of a preferred embodiment in which a digital media source takes the form of a kiosk.

In one example, which is shown in FIG. 4, the digital media source takes the form of a kiosk 100 in a retail store or a shopping center that is publicly accessible. In this illustration, the kiosk 100 is in a record store and allows customers to store one or more songs or albums onto a modular memory device 120. The kiosk 100 comprises a modular memory device port 105, which accepts a modular memory device 120 and leads to an electrical connector, and a display device 110. The kiosk 100 also comprises a user interface, which, in this example, takes the form of a touch screen integrated with the display device 110. The kiosk 100 can also comprise other user interface elements, such as a keyboard or a voice recognition unit.

Figure 3:
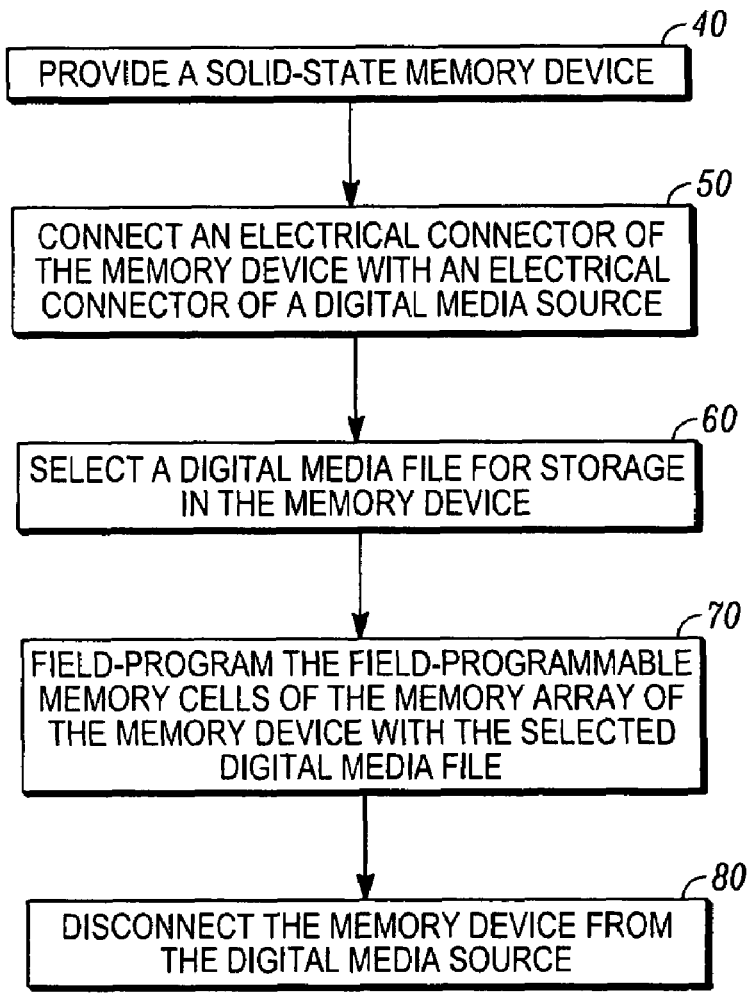
FIG. 3 is a flow chart of a method of a preferred embodiment for field-programming a solid-state memory device with a digital media file.

Turning now to the flow chart of FIG. 3, a solid-state memory device 120 is provided (act 40). A user can, for example, bring the memory device 120 with him to the kiosk 100, can purchase the memory device 120 from the retail store that houses the kiosk 100, or can purchase the memory device 120 directly from the kiosk 100. Next, the electrical connector of the memory device 120 is connected with the electrical connector of the kiosk 100 (act 50). A user can, for example, push the memory device 120 through the port 105 of the kiosk 100 to mate the electrical connectors. Alternatively, if the user purchases the memory device 120 from the kiosk 100, the kiosk 100 can automatically make the connection to the memory device 120. For example, a mechanical arm in the kiosk 100 can grab a memory device 120 from a storage bin and connect it with the electrical connector of the kiosk 100.

Next, a digital media file is selected for storage in the memory device 120 (act 60). In this illustration, a user manually selects one or more songs to be stored in the memory device 120. The display device 110 of the kiosk 100 presents choices to the user, such as a list of artists, album titles, and song titles. The user selects the content to be stored in the memory array of the memory device 120 by touching the desired displayed choice. Any other technique of providing the user with an indication of the digital media files available for selection can be used. Additionally, the kiosk 100 can also include a speaker or a pair of headphones to allow the user to preview the selection before storage. Further, the selection can be made automatically instead of manually, such as when the kiosk 100 automatically selects a song for storage in the user's memory device 120. For example, based on the user's past selections, the kiosk 100 (or a processor coupled with the kiosk 100) can determine which new artists the user may enjoy and can automatically select a song from one of those artists to store on the memory device 120 as a "free sample" to entice the user to purchase additional songs by that particular artist.

After the digital media file has been selected, the kiosk 100 field-programs the field-programmable memory cells of the memory array of the memory device 120 with the selected digital media file (act 70). The digital media file stored in the memory device 120 can be retrieved from a storage location internal to the kiosk 100, such as a local mass storage device 130 (e.g., a hard-disk drive or a CD-ROM drive), or from a storage location (or server) external to the kiosk 100. For example, the kiosk 100 can be in wired or wireless communication with a storage device located elsewhere in the record store or with storage devices 140, 141 external to the record store and accessible via a network 150, such as the Internet. By using both local and external storage devices, a record store can store popular songs or albums on the local mass storage device 130 for fast access, while storing less-frequently requested titles in external storage devices. Additionally, the storage devices can be controlled by parties other than the owners of the record store and kiosk 100. For example, the storage devices 140, 141 can be owned by different record labels and store songs by their respective recording artists. Further, instead of retrieving digital media files from a storage device, the kiosk 100 itself can generate some or all of the selected digital media files on-the-fly. For example, if the kiosk 100 has karaoke functionality, the kiosk 100 can generate a digital media file that is the combination of a selected instrumental track, which is retrieved by the kiosk 100, and a recording of the user's voice, which is created on-the-fly by the kiosk 100 using a microphone. As these examples illustrate, the kiosk 100 can reduce a record store's inventory of conventional, pre-recorded records or song titles by dispensing music on-the-fly.

While the kiosk 100 can be used to freely distribute digital media files, the kiosk 100 can also be used to charge a user for the digital media files stored in the memory device 120. Any suitable accounting system can be used, preferably one that provides a secure transaction for the consumer. For example, the user can insert a credit card into the kiosk 100 to purchase the selected songs or can establish an account with the record store that is debited in the amount appropriate for the downloaded songs. The accounting system can also keep track of the songs selected by a plurality of users to determine which songs should be stored locally and which songs should be stored in remote storage devices. This information can also be used to distribute royalties to the appropriate record labels or artists.

Figure 5:
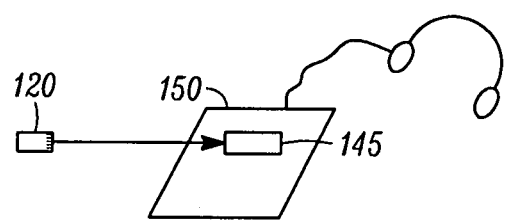
FIG. 5 is an illustration of a preferred embodiment in which a digital media playback device takes the form of a digital audio player.

After the digital media file is stored in the memory device 120, the memory device 120 is disconnected from the kiosk 100 (act 80). A user can, for example, pull the memory device 120 out of the kiosk 100 to decouple the electrical connectors. Alternatively, the kiosk 100 can automatically disconnect the memory device 120 and present it to the user. After the memory device 120 is removed from the kiosk 100, it can be inserted into a port 145 in a digital audio player 150 (see FIG. 5) or other digital media playback device to play the stored music.

In the example described above, the user of the kiosk 100 was the end user of the memory device 120. In another example, the user of the kiosk 100 is an employee of a retail store housing the kiosk 100. Consider an example where the kiosk 100 is located in a video store. When a customer requests a movie, the employee of the video store inserts a memory device 120 into the kiosk 100 and stores the requested movie onto the memory array. The employee then gives the modular memory device 120 to the customer, who can purchase or rent the stored movie. Because the movie is stored in the memory array on demand, the movie is never out-of-stock, eliminating the customer's need to race to the video store. In this example, a digital media file was stored in the memory array at the request of an end user. In another example, digital media files are stored in the memory array in advance of a request. For example, a book store can "mass customize" a book on several modular memory devices for on-sight distribution to customers. In this way, the book store stocks its shelves with the memory devices, and a customer purchases the customized memory device off the shelf without having to wait for the book to be stored in the device. As noted above, the selection of a digital media file can be automatic. For example, a kiosk in a book store can automatically select a book for mass storage when the book store's tracking system determines that there are no more memory devices storing the book on-shelf.

Figure 6:
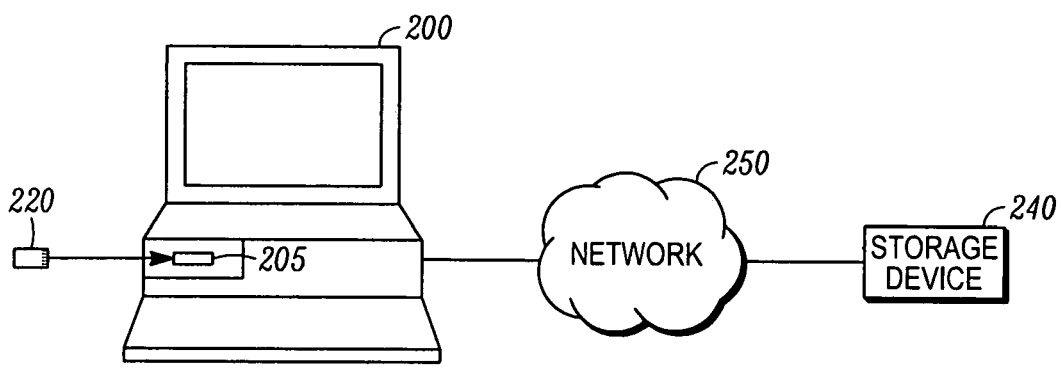
FIG. 6 is an illustration of a preferred embodiment in which a digital media source takes the form of a personal computer.

In the examples given above, the digital media source took the form of a kiosk. Other devices can be used in addition to a kiosk, such as an ATM machine or a digital phone in an airport or shopping center. Additionally, instead of being located in a retail store such as a record, video, or book store, the digital media source can be located at an end-user's premises, such as his home or office. For example, in FIG. 6, the digital media source takes the form of a personal computer 200, which is essentially a home-or office-based equivalent of the public kiosk 100 of FIG. 4. The computer 200 has a port 205 for a modular memory device 220. The port can be integrated with the personal computer 200 (as shown in FIG. 2) or can take the form of a separate, stand-alone peripheral.

As with the kiosk 100 in FIG. 4, the user can interact with the computer 200 to download digital media files from an external storage device 240 connected with the computer 200 via a network 250, such as the Internet. For example, a user can visit a recording artist's web page and download a song or album from that artist onto the memory device 220. It should be noted that the digital media source can take forms other than a kiosk or a personal computer. For example, the digital media source can take the form of a digital media playback device (e.g., a digital audio player, an electronic book, etc.). Digital media files can be downloaded by the digital media playback device from an external source, such as the Internet, and stored in the write-once memory array. Additionally, the digital media playback device can be connected to yet another digital media source. For example, instead of connecting a memory device with a kiosk, the memory device can be connected with a digital audio player, which is then connected to the kiosk.

Figure 7:
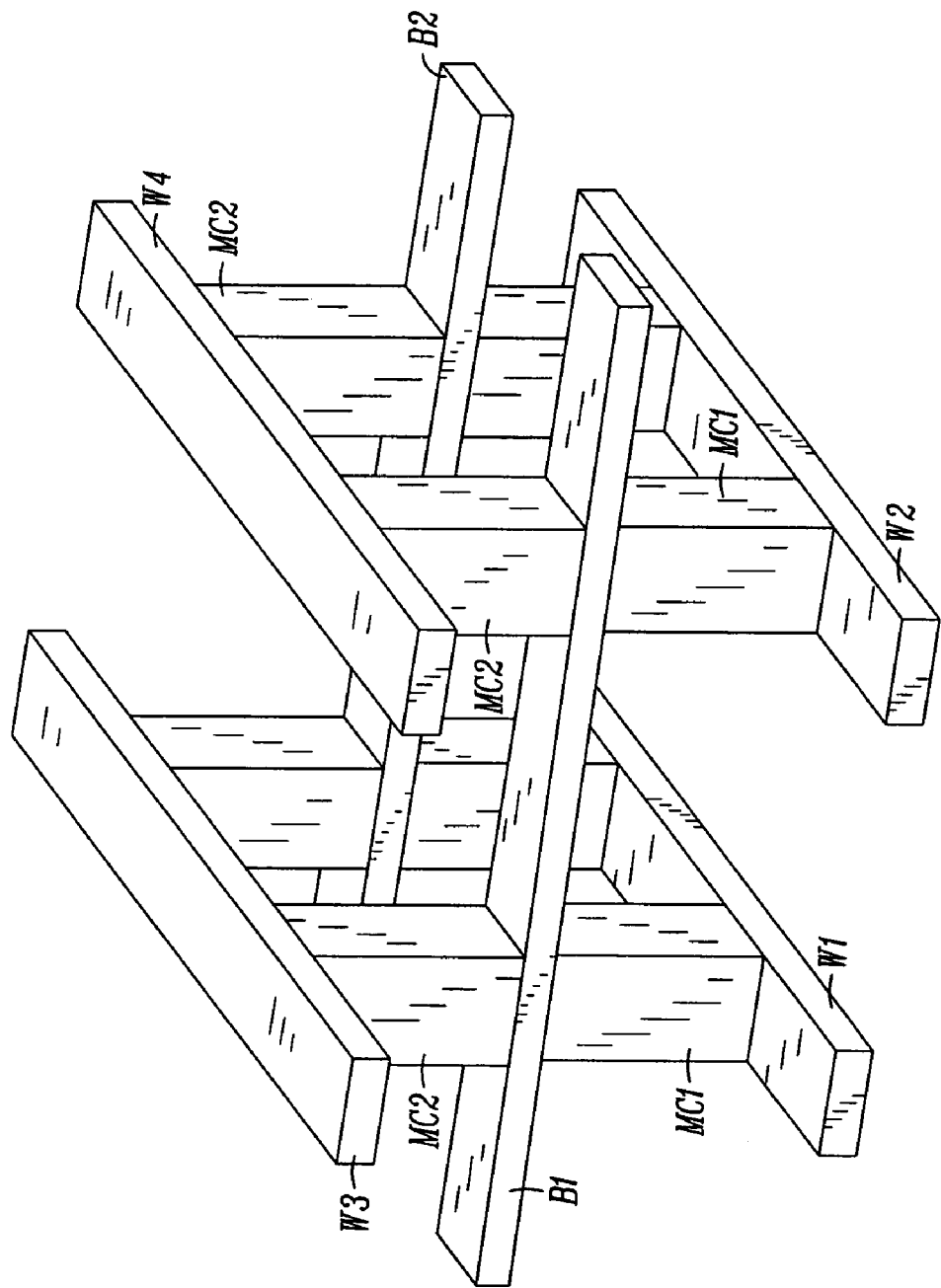
FIG. 7 is an illustration of a three-dimensional memory array of a preferred embodiment.

While the solid-state memory device can use a two-dimensional memory array of memory cells (write-once or write-many), it is preferred that the solid-state memory device use a three-dimensional memory array of memory cells (write-once or write-many). Turning again to the drawings, FIG. 7 is an illustration of a three-dimensional memory array of a preferred embodiment. The memory array of FIG. 7 is three-dimensional in the sense that the memory cells are arranged in a plurality of vertically-stacked layers to form a three-dimensional lattice above a substrate. The three dimensions are called "rows," "columns," and "layers." Typically, the rows and columns are generally parallel to the upper surface of an underlying substrate, and the layers are separated from one another along a direction perpendicular to the upper surface of the underlying substrate. Some prior memory cells contain an element that protrudes either upwardly or downwardly and have in the past been referred to as a "three dimensional memory cell." However, these memory cells are arrayed in a conventional two-dimensional array. This is quite different from the three-dimensional embodiments described herein, which include a three-dimensional array of memory cells, with several layers of memory cells stacked vertically above one another.

In FIG. 7, each of the memory cells MC1, MC2 is a two-terminal cell that includes a state storage element. In this embodiment, the memory cells MC1 are arranged at a first level, and the memory cells MC2 are arranged at a second level that is vertically stacked with respect to the first level. The terminals of the memory cells MC1, MC2 are disposed at the respective ends of the cell. In this connection, the term "terminal" is intended broadly, and a terminal may be embodied simply as a terminal portion of the cell, or as a separate layer of the cell. Each of the terminals of each of the memory cells MC1, MC2 is in electrical contact with a respective conductor or wire. The conductors W1, W2 at the bottom of the memory cells MC1 in the view of FIG. 7 are configured as wordlines, and the conductors B1, B2 connected to the upper terminals of the memory cells MC1 are configured as bitlines, which in this embodiment run substantially perpendicularly to the wordlines W1, W2. Thus, each of the memory cells MC1 bridges a selected one of the wordlines W1, W2 and a selected one of the bitlines B1, B2. Similarly, the memory cells MC2 of the second layer are connected between selected bitlines B1, B2 and selected wordlines W3, W4. The wordlines W3, W4 in this embodiment are disposed on another level, vertically stacked above the level of the bitlines B1, B2. In addition to referring to a physically discrete element as in FIG. 7, a memory cell can also be defined by rail-stacks and intermediate layers, as described in U.S. patent application Ser. No. 09/638,428, which is hereby incorporated by reference.

Three-dimensional, vertically-stacked memory arrays provide important economies in terms of reduced size of the memory array and associated reductions in manufacturing cost. In particular, these memory arrays use very small switching devices, giving a small memory cell and a small total chip area. In this way, manufacturing costs are minimized, resulting in a dramatic cost reduction compared to conventional memory arrays. The small switching devices of the preferred three-dimensional memory array give a small read current, which makes the read access time relatively slow. However, for many digital media files such as digital audio and digital images, the relatively slow speed is not a drawback, and the dramatically lower cost of the memory device is a strong benefit. Additionally, because they can be made relatively inexpensively, memory devices with a three-dimensional memory array can be used as the final storage location for digital media files rather than merely as a vehicle to move the files to a less expensive storage device, as is done with relatively more expensive two-dimensional solid-state memory devices. This provides the added advantage of eliminating a redundant copying step. In short, a solid-state memory device with a three-dimensional memory array provides a relatively low-cost, simple way of distributing digital media files to enable mass customization and on-sight sale or distribution at, for example, record and video stores.

While write-many memory cells can be used, it is preferred that the field-programmable memory cells of the memory array (e.g., a two-dimensional or three-dimensional memory array) are write-once memory cells. In a write-once, field-programmable memory cell, an original, un-programmed digital state of the memory cell (e.g., the Logic 0 state) cannot be restored once switched to a programmed digital state (e.g., the Logic 1 state). There are several advantages to using write-once memory cells instead of write-many memory cells. First, write-once memory cells are especially suitable for digital media storage applications used to fix copyrightable material in a tangible medium of expression. Because write-once memory cells permanently store data, they provide an unambiguous and immutable record of the expressed material, thereby protecting the integrity of the copyrighted material. Additionally, since write-once memory cells cannot be re-used to store new digital media files, there is no need for a copy protection system that allows a user to copy digital media files onto less expensive media while preventing further copying, as is needed with the write-many devices discussed in the background section above. In this way, a write-once memory device provides a way of permanently and securely distributing copyrightable data. Further, because a digital media file is permanently stored in a write-once memory device, the file can be "tied" to the memory device so that it will only play if played from that memory device. This form of copy protection and other alternatives that can be used with these preferred embodiments are described in U.S. patent applications Ser. Nos. 09/775,745 and 09/775,939, both of which are assigned to the assignee of the present invention and are hereby incorporated by reference.

As discussed above, in some embodiments, electrical connectors are not needed to store a digital media file onto a solid-state memory device and/or to play data stored on a solid-state memory device with a digital media playback device. For example, a digital media source can wirelessly transmit a digital media file for storage directly to a solid-state memory device, and a solid-state memory device can wirelessly transmit a digital media file for playback to a digital media playback device. Accordingly, the claims should not be read as requiring an electrical connector unless explicitly recited therein. Further, because a solid-state memory device can have a two-dimensional or three-dimensional memory array of write-once or write-many memory cells, the claims should not be read as requiring a specific type of array (e.g., a three-dimensional memory array) or a specific type of memory cell (e.g., a write-once memory cell) unless explicitly recited therein.

Lastly, it should be noted that the memory cells can be made from any suitable material. The memory cells are preferably made from a semiconductor material; however, other materials such as phase-change materials and amorphous solids as well as those used with MRAM and organic passive element arrays can be used. Three-dimensional memory arrays and additional features that can be used in combination with these preferred embodiments are described in the following patent documents, each of which is hereby incorporated by reference: U.S. Pat. Nos. 6,034,882 and 5,835,396 and U.S. patent applications Ser. Nos. 09/638,428; 09/638,334; 09/727,229; 09/638,439; 09/638,427; 09/638,334; 09/560,626; and 09/662,953.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for field-programming a solid-state memory device with a digital media file, the method comprising:
   (a) providing a solid-state memory device comprising a three-dimensional memory array of vertically-stacked field-programmable memory cells, the memory device further comprising an electrical connector coupled with the memory array;
   (b) connecting the electrical connector of the memory device with an electrical connector of a digital media source;
   (c) automatically selecting, based on a user's past selections, a digital media file from the digital media source for storage in the memory device;
   (d) field-programming the field-programmable memory cells of the three-dimensional memory array of the memory device with the selected digital media file;
   (e) disconnecting the memory device from the digital media source;
   (f) connecting the electrical connector of the memory device with an electrical connector of a digital media playback device, the digital media playback device being different from the digital media source; and
   (g) with the digital media playback device, playing the digital media file field-programmed in the memory device;
   wherein the digital media source is not a dedicated playback device for the digital media file.

2. The invention of claim 1, wherein the digital media source comprises a kiosk.

3. The invention of claim 1, wherein the digital media source is located in a retail store.

4. The invention of claim 1, wherein the digital media source is located on an end-user's premises.

5. The invention of claim 1, wherein the digital media source comprises a digital media playback device.

6. The invention of claim 1, wherein the digital media file comprises a digital media file selected from the group consisting of digital music, digital audio, digital video, at least one digital still image, a sequence of digital images, digital books, digital text, a digital map, digital data, games, software, or any combination thereof.

7. The invention of claim 1 further comprising retrieving the selected digital media file from a storage device internal to the digital media source.

8. The invention of claim 1 further comprising retrieving the selected digital media file from a storage device external to the digital media source.

9. The invention of claim 8, wherein the digital media source is coupled to the external storage device via a network.

10. The invention of claim 9, wherein the network comprises the Internet.

11. The invention of claim 1, wherein the selected digital media file is generated by the digital media source.

12. The invention of claim 1 further comprising charging a user of the memory device for the digital media file field-programmed in the memory device.

13. The invention of claim 1, wherein the digital media file will only play if played from the memory device.

14. The invention of claim 1, wherein the memory cells comprise write-once memory cells.

15. The invention of claim 1, wherein the memory cells comprise write-many memory cells.

16. The invention of claim 1, wherein the memory cells comprise a semiconductor material.

17. The invention of claim 1 further comprising:
 (f) connecting the electrical connector of the memory device with an electrical connector of the digital media playback device; and
 (g) with the digital media playback device, playing the digital media file field-programmed in the memory device.

18. The invention of claim 17, wherein the digital media playback device comprises a device selected from the group consisting of a digital audio player, a digital audio book, an electronic book, a digital camera, a game player, a general-purpose computer, a personal digital assistant, a portable telephone, a printer, and a projector.

19. A method for field-programming a solid-state, write-once memory device with a digital media file, the method comprising:
 (a) providing a solid-state memory device comprising a memory array comprising a plurality of write-once, field-programmable memory cells, the memory device further comprising an electrical connector coupled with the memory array;
 (b) connecting the electrical connector of the memory device with an electrical connector of a digital media source;
 (c) automatically selecting, based on a user's past selections, a digital media file from the digital media source for storage in the memory device;
 (d) field-programming the write-once, field-programmable memory cells of the memory array of the memory device with the selected digital media file;
 (e) disconnecting the memory device from the digital media source;
 (f) connecting the electrical connector of the memory device with an electrical connector of a digital media playback device, the digital media playback device being different from the digital media source; and
 (g) with the digital media playback device, playing the digital media file field-programmed in the memory device;
 wherein the digital media source is not a dedicated playback device for the digital media file.

20. The invention of claim 19, wherein the digital media source comprises a kiosk.

21. The invention of claim 19, wherein the digital media source is located in a retail store.

22. The invention of claim 19, wherein the digital media source is located on an end-user's premises.

23. The invention of claim 19, wherein the digital media source comprises a digital media playback device.

24. The invention of claim 19, wherein the digital media file comprises a digital media file selected from the group consisting of digital music, digital audio, digital video, at least one digital still image, a sequence of digital images, digital books, digital text, a digital map, digital data, games, software, or any combination thereof.

25. The invention of claim 19 further comprising retrieving the selected digital media file from a storage device internal to the digital media source.

26. The invention of claim 19 further comprising retrieving the selected digital media file from a storage device external to the digital media source.

27. The invention of claim 26, wherein the digital media source is coupled to the external storage device via a network.

28. The invention of claim 27, wherein the network comprises the Internet.

29. The invention of claim 19, wherein the selected digital media file is generated by the digital media source.

30. The invention of claim 19 further comprising charging a user of the memory device for the digital media file field-programmed in the write-once, field-programmable memory cells of the memory array of the memory device.

31. The invention of claim 19, wherein the digital media file will only play if played from the memory device.

32. The invention of claim 19, wherein the memory array comprises a three-dimensional memory array.

33. The invention of claim 19, wherein the memory array comprises a two-dimensional memory array.

34. The invention of claim 19, wherein the memory cells comprise a semiconductor material.

35. The invention of claim 19 further comprising:
 (f) connecting the electrical connector of the memory device with an electrical connector of the digital media playback device; and
 (g) with the digital media playback device, playing the digital media file field-programmed in the write-once, field-programmable memory cells of the memory array of the memory device.

36. The invention of claim 35, wherein the digital media playback device comprises a device selected from the group consisting of a digital audio player, a digital audio book, an electronic book, a digital camera, a game player, a general-purpose computer, a personal digital assistant, a portable telephone, a printer, and a projector.

37. A method for field-programming a solid-state memory device with a digital media file, the method comprising:
 (a) providing a solid-state memory device comprising a three-dimensional memory array of vertically-stacked field-programmable memory cells;
 (b) automatically selecting, based on a user's past selections, a digital media file from a digital media source for storage in the memory device;

(c) field-programming the three-dimensional memory array of vertically-stacked field-programmable memory cells with the selected digital media file;

(d) connecting the memory device to a digital media playback device, the digital media playback device being different from the digital media source; and (e) with the digital media playback device, playing the digital media file field-programmed in the memory device;

wherein the digital media source is not a dedicated playback device for the digital media file.

38. The invention of claim 37 further comprising connecting an electrical connector of the memory device with an electrical connector of the digital media source, and wherein the digital media file is transferred from the digital media source to the memory device via the electrical connectors.

39. The invention of claim 37, wherein the digital media file is transferred from the digital media source to the memory device via a wireless connection.

40. A method for field-programming a solid-state, write-once memory device with a digital media file, the method comprising:

(a) providing a solid-state memory device comprising a memory array comprising a plurality of write-once, field-programmable memory cells;

(b) automatically selecting, based on a user's past selections, a digital media file from a digital media source for storage in the memory device;

(c) field-programming the write-once, field-programmable memory cells of the memory array of the memory device with the selected digital media file;

(d) connecting the memory device to a digital media playback device, the digital media playback device being different from the digital media source; and (e) with the digital media playback device, playing the digital media file field-programmed in the memory device;

wherein the digital media source is not a dedicated playback device for the digital media file.

41. The invention of claim 40 further comprising connecting an electrical connector of the memory device with an electrical connector of the digital media source, and wherein the digital media file is transferred from the digital media source to the memory device via the electrical connectors.

42. The invention of claim 40, wherein the digital media file is transferred from the digital media source to the memory device via a wireless connection.

43. The invention of claim 37, wherein the three-dimensional memory array of vertically-stacked field-programmable memory cells comprises a plurality of layers of memory cells stacked vertically above one another in a single integrated circuit.

* * * * *